United States Patent [19]

Negishi

[11] Patent Number: 4,957,184

[45] Date of Patent: Sep. 18, 1990

[54] LOUDSPEAKER ENCLOSURE

[75] Inventor: Hirokazu Negishi, Surrey, England

[73] Assignee: Canon Kabushiki Kaisha, Tokyo, Japan

[21] Appl. No.: 311,861

[22] Filed: Feb. 17, 1989

[30] Foreign Application Priority Data

Feb. 24, 1988 [GB] United Kingdom ................. 8804232

[51] Int. Cl.[5] ................................................ H05K 5/00

[52] U.S. Cl. .................................... 181/153; 181/148; 181/199

[58] Field of Search ............... 181/129, 144, 146, 148, 181/151, 153, 171, 173, 199

[56] References Cited

U.S. PATENT DOCUMENTS

| | | | |
|---|---|---|---|
| 2,115,129 | 4/1938 | Thienhaus | 181/155 |
| 4,057,689 | 11/1977 | Stallings, Jr. | 181/145 X |
| 4,658,971 | 4/1987 | Curry | 181/129 |

FOREIGN PATENT DOCUMENTS 923070 7/1949 Fed. Rep. of Germany .

*Primary Examiner*—Benjamin R. Fuller
*Attorney, Agent, or Firm*—Fitzpatrick, Cella, Harper & Scinto

[57] ABSTRACT

The enclosure comprises inner and outer wall members with a vacuum space therebetween. The space is sealed by an O-ring and a flange of a loudspeaker at the mouth of the enclosure. The enclosure has the form of a vacuum-flask. It reduces unwanted propagation of sound by the enclosure.

10 Claims, 1 Drawing Sheet

LOUDSPEAKER ENCLOSURE

FIELD OF THE INVENTION

The present invention relates to a loudspeaker enclosure.

DESCRIPTION OF THE PRIOR ART

A loudspeaker is normally supported by an enclosure. Some sound energy from the loudspeaker is propagated by the enclosure resulting in undesired distortion of sound reproduced by the speaker. See for example Chapter 7 of "High Performance Loudspeakers" 3rd Edition, Martin Colloms, Pentech Press.

SUMMARY OF THE INVENTION

This invention is directed to the solution of the above problems of the prior art. It is therefore a general object of the invention to provide an enclosure which is capable of restraining the undesired distortion of sound reproduced b the speaker.

Under this object, a loudspeaker enclosure arranged according to this invention comprises a wall structure which includes a vacuum space.

Under this object, a loudspeaker system arranged according to this invention comprises an enclosure including a wall which structure includes a vacuum space, and a loudspeaker supported by the enclosure.

Other objects and features of this invention will become apparent from the following detailed description of embodiments thereof taken in connection with the accompanying drawing.

DETAILED DESCRIPTION OF PREFERRED EMBODIMENTS

Figure 1:
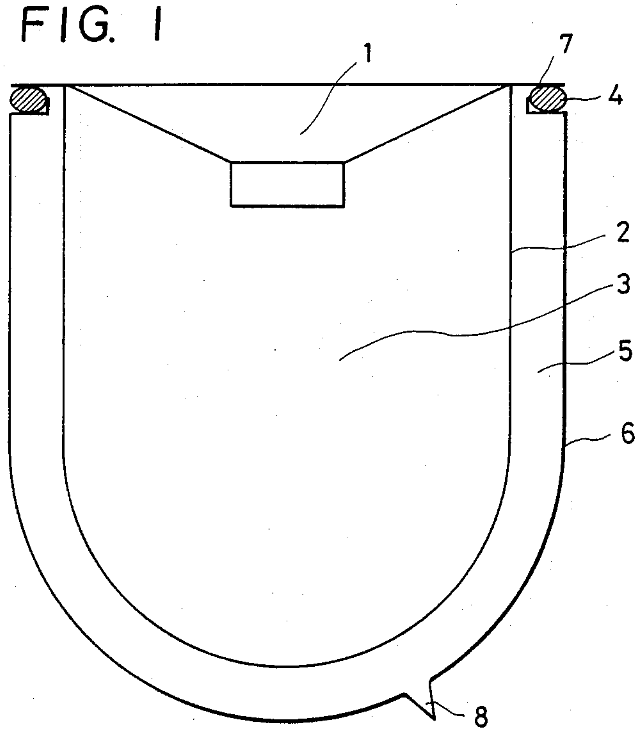
FIG. 1 is a top plan view in cross-section of a loudspeaker enclosure incorporating a loudspeaker according the present invention.

The enclosure comprises a wall structure having an inner wall 2 spaced from an outer wall 6 to define there between a vacuum space 5. The wall structure together with the loudspeaker at the mouth of the enclosure defines an internal space 3 which contains air and/or sound damping material.

The vacuum space 5 between the inner and outer walls 2 and 6 is closed by a flange 7 on the loudspeaker and an O-ring 4, the flange and O-ring being held in place by the external air pressure, once the vacuum space 5 is pumped out via port 8. Port 8 is sealed after pumping out.

The O-ring acts as a sound damper to reduce the transfer of sound energy from the speaker 1 to the wall structure. Because of the vacuum space 5, sound propagation by the structure of the enclosure is reduced.

The inner and outer walls may be of metal, glass or plastics. Plastics such as methyl methacrylate, polycarbonate, or polystyrene, may be useful. In addition, fibre reinforced plastics such as polyester could be useful. The materials used must be sufficiently strong and air tight.

Figure 2:
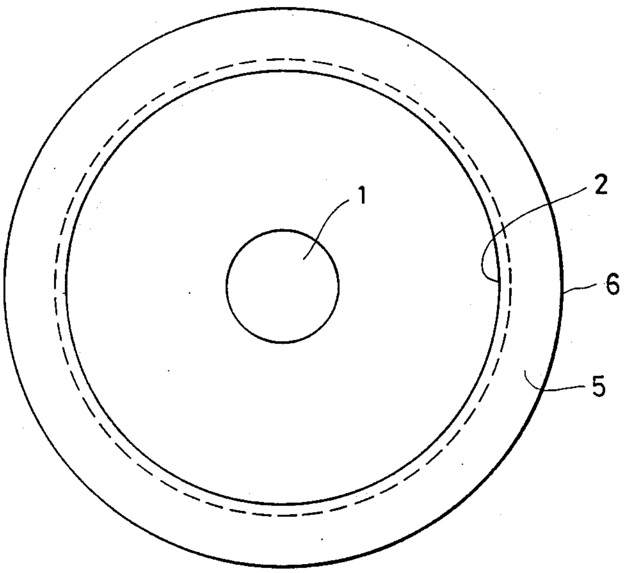
FIG. 2 an end view of the enclosure of FIG. 1.

Various changes and modifications may be made to the enclosure shown in FIGS. 1 and 2.

Instead of the O-ring some other seal could be used. In addition to, or instead of the seal providing damping, other damping means could be provided.

Further mechanical support for the loudspeaker and between the inner and outer walls may be provided. However, excessive support will bridge sound propagation between the walls. The material of the mechanical support should provide good damping. Lead, bitumen or polyurethane may be useful.

The space between the inner and outer walls may be permanently sealed by a seal integral with the wall members. For example, the inner and outer walls may be sealed together (like a vacuum flask) at the mouth of the enclosure.

In the event that it is difficult to maintain a high degree of vacuum, the sealed port 8 may be replaced by a valve for connection to a vacuum pump. The pump would be operated only when the loudspeaker is not in use to avoid interfering with sound reproduction. A sensor for sensing the degree of vacuum may be used. In addition, a controller for automatically turning on the pump in response to the sensor when the speaker is not in use may be used.

The enclosure may be of any suitable shape. A spherical or cylindrical shape would be appropriate.

The inner wall 2 may by formed of a single piece. The outer wall 6 may be formed of two pieces.

There may be multiple internal walls one within another.

Several loudspeakers may be isolated from one another using enclosures as described above.

The present invention may be applied to the loudspeaker systems described and claimed in our copending British Patent Application No. 8707400, GB-A-2188811; and 8728793; the disclosures of which are hereby incorporated herein.

What is claimed is:

1. A loudspeaker enclosure, comprising:

an inner wall member;

an outer wall member spaced from said inner wall member and defining a volume space therebetween, said inner and outer wall members being sealed and the volume space evacuated of air to define a vacuum space therebetween, and said inner and outer wall members defining an opening in which a loudspeaker can be arranged.

2. An enclosure according to claim 1, wherein said inner and outer wall members are joined by a sealing member integral with the said wall members to define the vacuum space.

3. An enclosure according to claim 1, wherein the vacuum space is permanently closed.

4. An enclosure according to claim 1, further comprising a valve for coupling the vacuum space to a vacuum pump.

5. An enclosure according to claim 1, wherein said inner and outer wall members are made of plastic material.

6. A loudspeaker system, comprising;

enclosure means including an inner wall member and an outer wall member spaced apart from one another and defining a volume space therebetween, said wall members being sealed and the volume space evacuated of air to define a vacuum space therebetween; and a loudspeaker supported by said enclosure means at an opening defined by said inner and outer wall members.

7. A system according to claim 6, further comprising at least one sound damping member for coupling said loudspeaker with the opening in said enclosure means.

8. A system according to claim 6, wherein said enclosure means further includes sealing means for co-operating with said inner and outer wall members to define the vacuum space.

9. A system according to claim 8, wherein said sealing means includes a flange on said loudspeaker.

10. A system according to claim 8, wherein said sealing means includes a sound damping member and a flange on said loudspeaker.

* * * * *

UNITED STATES PATENT AND TRADEMARK OFFICE

CERTIFICATE OF CORRECTION

PATENT NO. : 4,957,184

DATED : September 18, 1990

INVENTOR(S) : Hirokazu Negishi

It is certified that error appears in the above-identified patent and that said Letters Patent is hereby corrected as shown below:

COLUMN 2:

Line 59, "comprising;" should read --comprising:--.

Signed and Sealed this

Twenty-eighth Day of April, 1992

*Attest:*

HARRY F. MANBECK, JR.

*Attesting Officer* *Commissioner of Patents and Trademarks*